Sept. 24, 1963 N. B. BRAYMER 3,105,223

MULTIPLE SWITCHING CIRCUIT

Filed March 17, 1959

INVENTOR.
NOEL B. BRAYMER

BY HIS ATTORNEYS.
HARRIS, KIECH, RUSSELL & KERN

United States Patent Office 3,105,223
Patented Sept. 24, 1963

3,105,223
MULTIPLE SWITCHING CIRCUIT

Noel B. Braymer, Garden Grove, Calif., assignor to Beckman Instruments, Inc., a corporation of California Filed Mar. 17, 1959, Ser. No. 799,991
8 Claims. (Cl. 340—147)

This invention relates to multiple switching circuits and in particular to a switching circuit for use with non-ideal switches to provide performance equivalent to that obtainable with ideal switches. This application is a continuation-in-part of application Serial No. 727,667, filed April 10, 1958, and now abandoned.

An ideal electrical switch would be a two-terminal device with two conditions, closed and opened or on and off. In the off condition, no electrical current would exist between the two terminals; in the on condition, there would be no potential difference across the two terminals. A very close approximation to the ideal switch is obtained with metallic contact switches and relays when used at D.C. and very low frequencies. However, metallic contact switches are not suitable for use in many applications, such as where the required switching rate is high or where the required number of operating cycles is great.

In many applications of switching circuits, electronic or semiconductor switching devices must be used in order to meet the required operating conditions. However, these switching devices do not approach the ideal in many respects, having appreciable internal resistance in the on or conducting condition and having appreciable conductance in the off or nonconducting condition. Furthermore, the magnitudes of these undesirable characteristics vary from unit to unit and vary with time, temperature and other parameters.

When a plurality of electrical signals may be connected to a single device, each signal is connected through a switch to the device with only one of the switches in the on or conducting condition at any time. Using ideal switches, the signal at the input to the device will exactly reproduce the one selected input signal. However, such is not true when nonideal switches are employed.

Accordingly, it is an object of the invention to provide a multiple switching circuit using nonideal switches in which the output is substantially identical to the selected input. A further object of the invention is to provide such a circuit in which neither the equipment connected to the output nor the unselected inputs require current from the selected input.

It is a further object of the invention to provide a multiple switching circuit in which a signal substantially equal to the selected signal is fed back to unselected inputs for compensating for the effects of nonideal switches. Another object of the invention is to provide such a circuit employing a unity gain, potentiometric-type feedback amplifier having high impedance input and low impedance output for effectively isolating the selected channel from the nonselected channels and the output load.

It is another object of the invention to provide a multiple switching circuit having a plurality of T-connected transistor switches and a unity gain amplifier with two arms of each T connected in series between an input terminal and the amplifier input and with the remaining arm of each T connected to the amplifier output. A further object of the invention is to provide an improvement on the switching circuit shown in the copending application of Lawrence M. Silva, entitled "Multichannel Selector," Serial No. 727,691, filed April 10, 1958, now abandoned, and assigned to the same assignee as this invention.

The invention also comprises novel details of construction and novel combinations and arrangements of parts, which will more fully appear in the course of the following description. The drawing merely shows and the description merely describes preferred embodiments of the present invention which are given by way of illustration or example.

Figure 1:
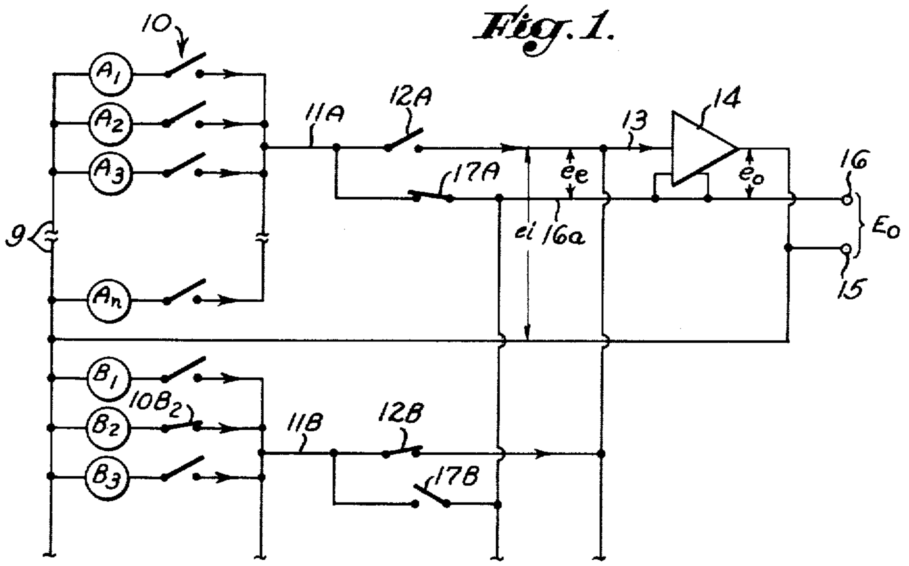
FIG. 1 is a schematic diagram of one form of the circuit of the invention.

In the circuit of FIG. 1, input signals from a plurality of sources A1, A2, A3, . . . A*n*, B1, B2, B3, . . . are coupled to corresponding input terminals with the sources being divided into groups indicated by the letters A, B, . . . . One terminal of each source is connected to a common line 9, which may be the circuit ground. The circuit of the invention will work with a large number of inputs, such as with ten groups of ten terminals each and higher, but only a portion of the inputs are shown in the drawing. A plurality of switches 10, one associated with each input terminal, provide for connecting each input terminal to a corresponding group bus or line 11A, 11B, . . . . Switches 12A, 12B, . . . serve to connect each group line to an amplifier input line 13 which drives an amplifier 14. The output of the amplifier appears at output terminals 15, 16, with the terminal 15 connected to the source common line 9 and the terminal 16 connected to an amplifier output line **16*a*. Switches 17A, 17B**, . . . serve to connect each group line to the amplifier output line.

When selecting a particular input signal for the output terminal, the particular switches 10 and 12 associated with the input terminal to which the signal is connected and the switches 17 not associated with this input terminal are in the on or conducting condition and all other switches are in the off or nonconducting condition. FIG. 1 illustrates the case where the signal of source B2 is selected. The switches 10B2, 12B and 17A, . . . are in the on condition and all other switches are in the off condition. The amplifier 14 desirably has unity gain with a high input impedance presenting substantially no load to the selected signal and having a low output impedance for supplying current to the output terminals and to the unselected inputs. Since the accuracy of reproduction of the selected input signal at the output terminals is a function of the gain of the amplifier, the nearer this gain is to unity, the greater the accuracy of the circuit will be.

The amplifier 14 of FIG. 1 is connected as a potentiometric type feedback amplifier having one hundred percent feedback and thereby substantially unit gain. As shown, one input and one output terminal of amplifier 14 are connected together and to switches 17A and 17B and output terminal 16. The other input terminal of amplifier 14 is connected to amplifier input line 13. The other output terminal of amplifier 14 is connected to common line 9 and output terminal 15. This connection places the entire amplifier output in series with the input of the amplifier, e.g., for the circuit shown in FIG. 1, the entire output potential between output terminals 16 and 15 is connected in series with source B2 and the input terminals of amplifier 14. The output $e_o$ of the amplifier is equal to the input $e_i$ thereof, i.e., $e_o=e_i$, taken with respect to circuit ground, i.e., line 9, when the amplifier has substantially unity gain, the amplifier providing the desired high input impedance and low output impedance. The output amplifier 14 is fed back to the input such that the error voltage $e_e$, which appears across the input terminals of the amplifier, is the difference between the input voltage $e_i$ from the signal source and the amplifier output voltage $e_o$, i.e., $e_c=e_i-e_o$. The amplifier output 15 is connected to the common side 9 of the signal sources. An example of a suitable amplifier may be found in FIG. 5.13 of Transistor Circuit Engineering, edited by R. F. Shea, John Wiley & Sons, Inc., New York, 1957.

The fact that the selected switches (10B2, 12B, FIG. 1) have impedances that are different from zero, is of very little importance when the input impedance of the amplifier is high. The impedances of such selected switches are in series with the high input impedance of the amplifier, so this high input impedance makes the nonzero impedances of the selected switches 10B2 and 12B relatively unimportant.

There is a feedback path through nonselected switches to the input; e.g. switch 12A in FIG. 1. When the amplifier gain should be different from unity, the over-all gain (i.e., the gain including the feedback through open, nonselected switches) would be dependent on the impedance of said switches, and therefore variable. When the gain of the amplifier itself is unity, variations in impedance of open switches or nonuniformity of switches cannot have any influence on the system as it cannot make any difference to a system whether points of equal potential are connected by a high or low impedance. In a typical case, an amplifier gain between 1.02 and 0.98 will give satisfactory results depending upon the characteristics of the switches used in the system. Thus, the signals connected to nonselected input terminals A1, A2, A3 . . . A*n* will have a negligible effect on the output of the amplifier 14. Although the switches 10 associated with each input terminal are presumed to be non-ideal switches with appreciable conductance in their nonconducting condition, each of these switches are connected between the output terminals 15 and 16 via conducting switch 17A and line **16*a*. The high open circuit impedances of these switches are then connected in parallel across the output of amplifier 14. Amplifier 14 being connected as a unity gain amplifier, has a very low output impedance and is therefore not appreciably loaded by the open switches 10. The small current flow through these nonconducting switches will thus have practically no effect on the output signal measured across output terminals 15 and 16**.

Figure 2:
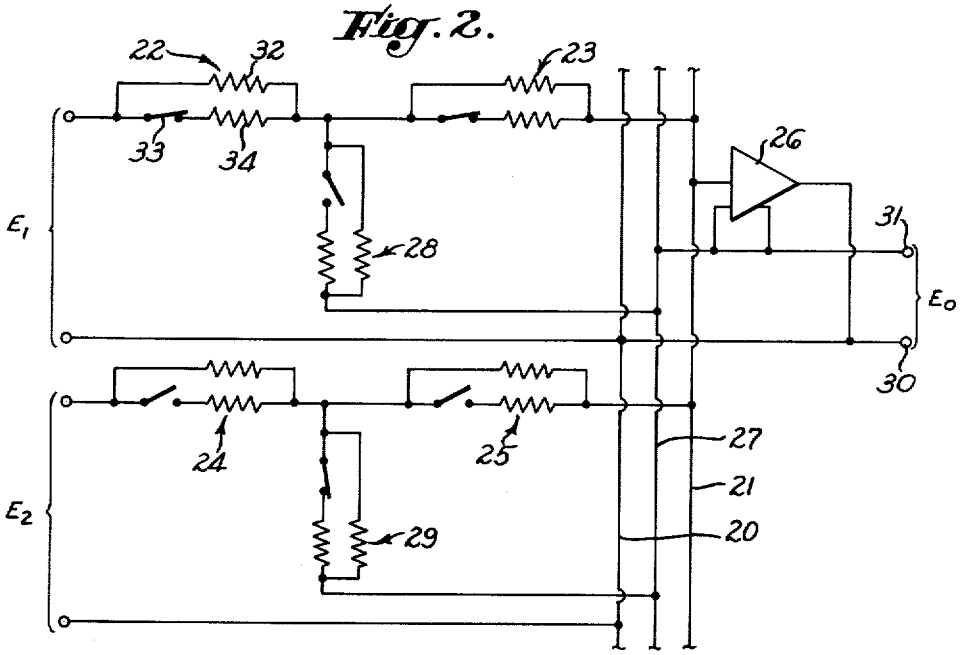
FIG. 2 is a schematic diagram of an alternative form of the circuit of the invention.

Another form of the circuit of the invention is shown in FIG. 2. One terminal of each input E1, E2, . . . is connected to a common line 20 which may be referred to as circuit ground. The other terminal of E1 is connected to amplifier input line 21 through two serially connected switches 22, 23 and the other terminal of input E2 is similarly connected to the amplifier input line through switches 24, 25. Additional inputs may be connected into the circuit in the same manner. The amplifier input line 21 provides the input to a unity gain amplifier 26 which is connected in the same manner as the amplifier 14 of the circuit of FIG. 1. One side of the amplifier output is connected to an output terminal 30 and to the common line 20 and the other side to an output terminal 31 and to an amplifier output line 27. A switch 28 is connected between the junction of the switches 22, 23 and the amplifier output line 27, and a switch 29 is similarly connected between the junction of the switches 24, 25 and the amplifier output line.

Each of the switches shown in FIGS. 1 and 2 may be of any desirable type, such as metallic contact, vacuum tube, and semiconductor, the choice of a particular switch being dependent upon the application of the switching circuit and not being material to this invention. In FIG. 1, each switch is represented merely as an off-on device. In FIG. 2, each switch is represented by an equivalent circuit of a nonideal switch having a large resistance 32 in parallel with a series combination of an ideal off-on device 33 and a small resistance 34.

In the operation of the circuit of FIG. 2, the pair of series connected switches which connect the desired input to the amplifier input line are conducting and the switch which connects the junction of these two switches to the amplifier output line is not conducting. The switches associated with each of the undesired inputs are in the reverse condition as the corresponding switch associated with the selected input. As shown in FIG. 2, E1 is the selected input and switches 22, 23 and 29 are conducting and switches 28, 24 and 25 are not conducting. Under these conditions, the output $E_o$ will be substantially equal to the input E1, unaffected by the resistance of and variations in the on and off condition resistances of the various switches in the circuit.

In the circuit of FIG. 1, the output of the amplifier serves to eliminate the groups of nonselected switches A, C, . . . . However, the voltage at nonselected inputs B1, B3, . . . may still influence the input to the amplifier because of the finite impedances of the associated switches. In the circuit of FIG. 2, the effects of the nonselected input signals are eliminated from the amplifier input. The switch 29 in the nonselected circuit connects the source E2 to the low impedance side 31 of the amplifier 26. There is a voltage drop across this switch and, because of the finite impedance of the open switch 24, some leakage current exists. However, this leakage has no influence on the output voltage $E_o$ because of the direct connection between the switch 29 and the amplifier output, the output impedance of the amplifier being quite low because of the high loop gain.

The terms "connect" and "conducting," and "disconnect" and "nonconducting," as used in the specification and claims, indicate that the switch involved is in the on and off conditions respectively, although it is realized that nonideal switches are never completely disconnected or nonconducting.

Although exemplary embodiments of the invention have been disclosed and discussed, it will be understood that other applications of the invention are possible and that the embodiments disclosed may be subjected to various changes, modifications and substitutions without necessarily departing from the spirit of the invention.

I claim as my invention:

1. In a multiple switching circuit, the combination of: a plurality of inputs divided into a plurality of groups of inputs; a plurality of junctions, one of said junctions corresponding to each of said groups respectively; a plurality of first switches, one of said first switches being coupled to each of said inputs respectively for selectively connecting each input of each of said groups to the corresponding junction; a first output; a plurality of second switches, one of said second switches corresponding to each of said groups respectively, for selectively connecting each of said junctions to said first output; amplifier means coupled to said first output, said amplifier producing a second output substantially equal in voltage to said first output; and a plurality of third switches, one of said third switches corresponding to each of said groups respectively, for connecting said second output to each of said junctions to which said first output is not connected.

2. In a switching circuit for connecting one of a plurality of inputs to an output, the combination of: an amplifier; a switch means in series with each of the plurality of inputs respectively for connecting one of the plurality of inputs as the input of said amplifier and disconnecting the remaining of the plurality of inputs from said amplifier input; and means for connecting the output of said amplifier to the remaining of the plurality of inputs for eliminating potential differences across the disconnected switch means.

3. In a switching circuit, the combination of: an amplifier having a relatively high impedance input and a relatively low impedance output and having substantially unity gain; an amplifier input line connected to said amplifier input; an amplifier output line connected to said amplifier output; a plurality of intermediate lines; a plurality of circuit inputs divided into groups; a plurality of circuit input switches for connecting said circuit inputs to said intermediate lines, all of the inputs of a group being connectable to the same intermediate line, each of said input switches having on and off conditions; a plurality of intermediate switches for connecting said intermediate lines to said amplifier input line, each of said intermediate switches having on and off conditions; and a plurality of output return switches for connecting said intermediate lines to said amplifier output line, each of said output return switches having on and off conditions.

4. In a multiple input switching circuit, the combination of: a plurality of input lines; a first output line; a second output line; an amplifier having a pair of input terminals and a pair of output terminals; means for connecting one of said pair of input terminals and one of said pair of output terminals to said first output line; means for connecting said second output line to the other of said pair of output terminals of said amplifier; a plurality of pairs of serially connected switches for respectively connecting said input lines to said first output line, the switches of each of said pairs meeting at a junction; and a corresponding plurality of switches for connecting said junctions to the other of said pair of input terminals of said amplifier.

5. In a switching circuit for connecting one of a plurality of inputs to an output, the combination of: a plurality of switching circuits, each of said switching circuits including three switches connected at a common junction; an amplifier having substantially unity gain; means for connecting the first switch of each of said switching circuits to one of the inputs respectively; means for connecting the second switch of each of said switching circuits to the input of said amplifier; means for connecting the third switch of each of said switching circuits to the output of said amplifier; and means for changing the first and second switches of one of said switching circuits and the third switch of the remaining of said switching circuits to the on condition and the first and second switches of said remaining switching circuits and the third switch of said one switching circuit to the off condition for producing substantially zero voltage difference across the second and third switches of each of said remaining switching circuits.

6. In a switching circuit for connecting one of a plurality of inputs to an output, the combination of: an amplifier; a switch means in series with each of the plurality of inputs respectively for connecting one terminal of one of the plurality of inputs as the input of said amplifier and disconnecting the remaining of the plurality of inputs from said amplifier input; means for directly connecting one terminal of the output of said amplifier to the other terminal of each of the plurality of inputs; and means for connecting the other terminal of the output of said amplifier to the remaining of the one terminals of the plurality of inputs for eliminating potential differences across the disconnected switch means.

7. In a switching circuit for connecting one of a plurality of sources to an output with each source having one terminal common with one output terminal, the combination of: a plurality of switching circuits, each of said switching circuits including three switches connected at a common junction; an amplifier having a first input, a first output and a common input and output, with the amplifier output corresponding to the circuit output; means for connecting the first switch of each of said switching circuits to the other terminal of the sources respectively; means for connecting the second switch of each of said switching circuits to said first input of said amplifier; means for connecting the third switch of each of said switching circuits to said common input and output of said amplifier; means for connecting said first output of said amplifier to said one output terminal; and means for changing the first and second switches of one of said switching circuits and the third switch of the remaining of said switching circuits to the on condition and the first and second switches of said remaining switching circuits and the third switch of said one switching circuit to the off condition for producing substantially zero voltage difference across the second switch of each of said remaining switching circuits.

8. In a switching circuit, the combination of: an amplifier having a relatively high impedance input and a relatively low impedance output; an amplifier input line connected to the high side of said amplifier input; a first amplifier output line connected to the high side of said amplifier output; a second amplifier output line connected to the low side of said amplifier output and input; a plurality of intermediate lines; a plurality of circuit inputs divided into groups; a plurality of circuit input switches for connecting one terminal of corresponding circuit inputs to said intermediate lines, all of the inputs of the group being connectable to the same intermediate line, each of said input switches having on and off conditions; means for directly connecting the other terminal of each of said circuit inputs to said first amplifier output line; a plurality of intermediate switches for connecting said intermediate lines to said amplifier input line, each of said intermediate switches having on and off conditions; and a plurality of output return switches for connecting said intermediate line to said second amplifier output line, each of said output return switches having on and off conditions.

References Cited in the file of this patent

UNITED STATES PATENTS

| | | |
|---|---|---|
| 2,315,784 | Goodale | Apr. 6, 1943 |
| 2,558,018 | Thornton et al. | June 26, 1951 |
| 2,657,318 | Rack | Oct. 27, 1953 |
| 2,782,307 | Von Sivers et al. | Feb. 19, 1957 |
| 2,853,693 | Lindenblad | Sept. 23, 1958 |

UNITED STATES PATENT OFFICE

CERTIFICATE OF CORRECTION

Patent No. 3,105,223 September 24, 1963

Noel B. Braymer

It is hereby certified that error appears in the above numbered patent requiring correction and that the said Letters Patent should read as corrected below.

Column 2, line 53, for "unit" read -- unity --; line 69, after "output" insert -- of --.

Signed and sealed this 14th day of April 1964.

(SEAL)
Attest:

EDWARD J. BRENNER

ERNEST W. SWIDER
Attesting Officer

Commissioner of Patents